(12) United States Patent
Dispenza et al.

(10) Patent No.: US 11,474,179 B2
(45) Date of Patent: Oct. 18, 2022

(54) METHOD AND SYSTEM FOR IN-PHASE AND OUT-OF-PHASE MAGNETIC RESONANCE IMAGING

(71) Applicant: Siemens Healthcare GmbH, Erlangen (DE)

(72) Inventors: Nadine Dispenza, Erlangen (DE); Dominik Paul, Bubenreuth (DE); Manuel Stich, Parkstein (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/149,040

(22) Filed: Jan. 14, 2021

(65) Prior Publication Data

US 2021/0223342 A1    Jul. 22, 2021

(30) Foreign Application Priority Data

Jan. 16, 2020   (EP) ..................................... 20152236

(51) Int. Cl.
*G01V 3/00* (2006.01)
*G01R 33/48* (2006.01)
*G01R 33/54* (2006.01)
*G01R 33/56* (2006.01)

(52) U.S. Cl.
CPC ....... *G01R 33/4828* (2013.01); *G01R 33/543* (2013.01); *G01R 33/5608* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | |
|---|---|---|---|
| 5,917,323 A * | 6/1999 | Du | G01R 33/56554 324/309 |
| 2004/0064032 A1 | 4/2004 | Ma | |
| 2008/0021303 A1* | 1/2008 | Krueger | G01R 33/5615 600/410 |
| 2009/0253983 A1* | 10/2009 | Foo | G01R 33/563 600/420 |
| 2012/0074940 A1* | 3/2012 | Kimura | G01R 33/4818 324/314 |
| 2016/0033605 A1 | 2/2016 | Stemmer et al. | |
| 2017/0201339 A1* | 7/2017 | Chang | H04L 27/00 |

(Continued)

FOREIGN PATENT DOCUMENTS

JP    2006227774 A   *  8/2006

OTHER PUBLICATIONS

European Search Report dated Jul. 21, 2020, Application No. 20152236.4.

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

In a method for MRI of an object, spins of a first material and spins of a second material are excited. An in-phase echo signal is acquired when the spins are in-phase and an out-of-phase echo signal is acquired, when the spins are out of phase. A first image for the first material and/or a second image for the second material is generated by a computing unit depending on the in-phase echo signal and the out-of-phase echo signal. For acquiring the out-of-phase echo signal, a momentum space is sampled asymmetrically in a read-out direction.

19 Claims, 4 Drawing Sheets

(56) References Cited

U.S. PATENT DOCUMENTS

2018/0203087 A1* 7/2018 Ye .................. G01R 33/443
2019/0137590 A1 5/2019 Paul et al.
2019/0369195 A1 12/2019 Zeller

* cited by examiner

METHOD AND SYSTEM FOR IN-PHASE AND OUT-OF-PHASE MAGNETIC RESONANCE IMAGING

CROSS REFERENCE TO RELATED APPLICATIONS

This patent application claims priority to European Patent Application No. 20152236.4, filed Jan. 16, 2020, which is incorporated herein by reference in its entirety.

BACKGROUND

Field

The present disclosure relates to a method and system for magnetic resonance imaging (MRI) of an object.

Related Art

Different materials or molecules, in particular, water molecules and fat molecules, have slightly different nuclear spin resonance frequencies. Therefore, when performing a magnetic resonance imaging, MRI, acquisition, their spins go in-phase and out-of-phase with each other over time.

The time points of the different materials spins being in-phase or out-of-phase depend on the field strength of the MRI main magnetic field. The interval between and in-phase and an out-of-phase conditioning decreases linearly with increasing field strength B: $\Delta t = 1/(2*B*\gamma*3.4*10^{-6})$, wherein $\gamma$ denotes the gyromagnetic ratio.

A post-processing algorithm can then separate fat and water related signals to create two images displaying fat and water fractions only, respectively. This technique is known as Dixon imaging.

Since for Dixon imaging, two time points must be acquired, each echo train must be acquired twice for a turbo spin echo, TSE, sequence with the second repetition having the data acquisition periods shifted by the afore mentioned $\Delta t$. This leads to twice the measurement time compared to a standard TSE sequence.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
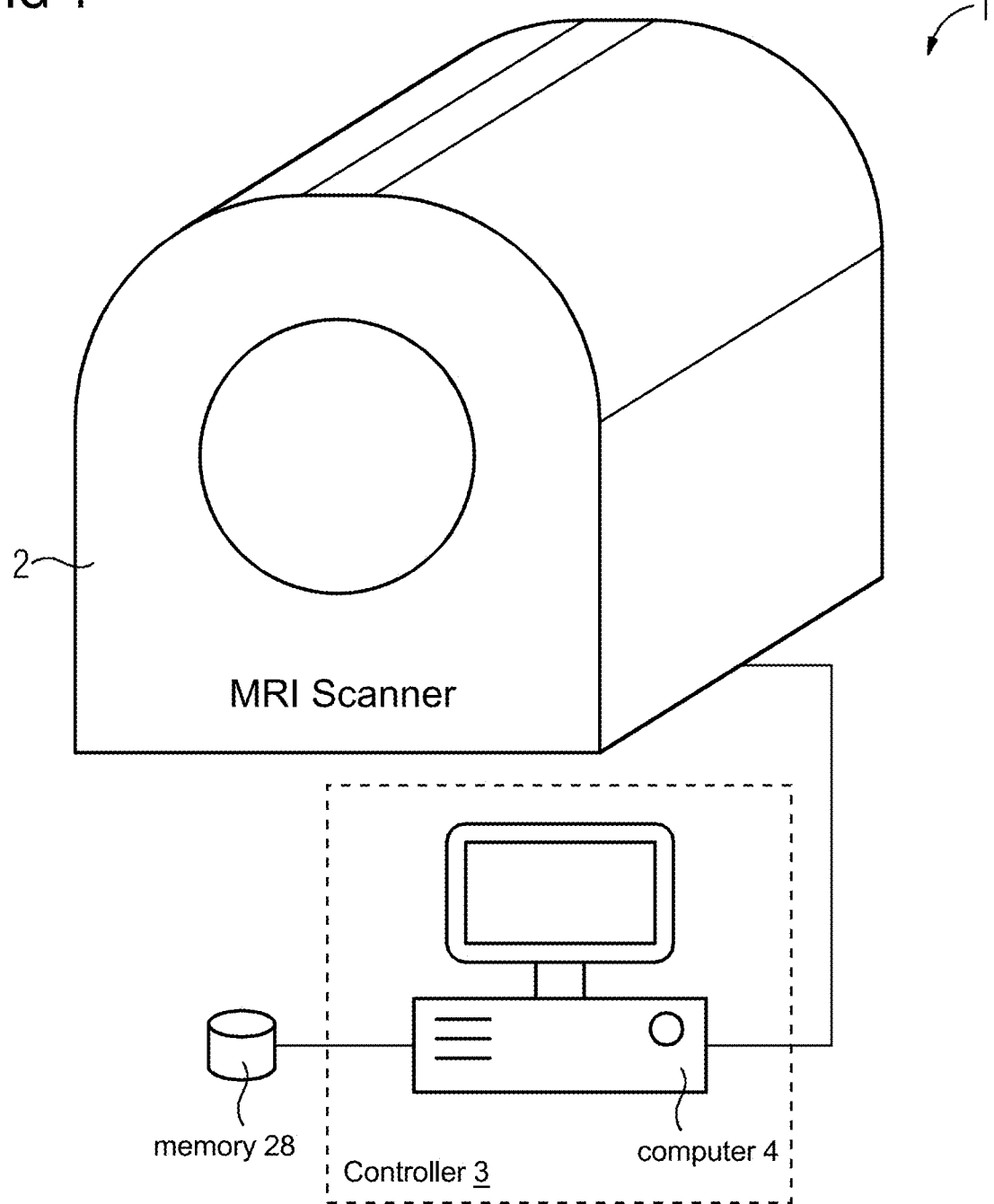
FIG. 1 illustrates a magnetic resonance imaging (MRI) system according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

It is therefore an object of the present disclosure, to provide an improved concept for in-phase and out-of-phase magnetic resonance imaging that allows for a reduced acquisition time. In an exemplary aspect, in a method and system for magnetic resonance imaging (MRI) of an object, spins of a first material of the object and spins of a second material of the object are excited, an in-phase echo signal is acquired when the excited spins of the first material and the excited spins of the second material are in-phase and an out-of-phase echo signal is acquired when the excited spins of the first material, and the excited spins of the second material are out-of-phase and a first image for the first material and/or or a second image for the second material is generated by a computing unit depending on the in-phase echo signal and the out-of-phase echo signal.

The improved concept is based on the idea to sample the momentum space in read-out direction asymmetrically for acquiring the out-of-phase echo signal.

In a method for magnetic resonance imaging (MRI) of an object, spins of a first material of the object and spins of a second material of the object are excited, in particular by applying one or more excitation pulses to the object. An in-phase echo signal is acquired when the excited spins of the first material and the excited spins of the second material are in-phase and an out-of-phase echo signal is acquired, when the excited spins of the first material and the excited spins of the second material are out-of-phase. A first image, in particular a first MRI image, for example, a first position MRI image for the first material and/or a second image, in particular a second MRI image, for example, a second position MRI image for the second material is generated by a computing unit depending on the in-phase echo signal and the out-of-phase echo signal. Therein, for acquiring the out-of-phase echo signal, a momentum space is sampled asymmetrically in a read-out direction.

The one or more excitation pulses correspond in particular to 90° pulses generated by one or more respective excitation coils to flip the spins by 90° from the direction of a static main magnetic field.

The excitation pulses are, in particular, pulses of electromagnetic waves, for example radio frequency, RF, pulses.

The in-phase and out-of-phase echo signals are acquired by applying respective read-out gradients, that is magnetic field gradients, and, for example, respective slice selection gradients and, for example, respective phase gradients in respective directions and by reading out the signals of respective acquisition coils.

The spins of the first and the second material can be understood as respective nuclear spins within a spatial region subject to the excitation pulses.

In general, magnetic field gradients can be applied in three spatial directions by means of corresponding gradient coils. Here and in the following, an axis perpendicular to the plane of the desired tomography slices is denoted as slice selection direction or, without restriction of generality, as z-direction. A corresponding magnetic field gradient in this direction is denoted as slice selection gradient or $G_z$. The slice selection gradient is, in particular, applied during the excitation of the spins by the excitation pulses.

A direction perpendicular to the slice selection direction, without restriction of generality the y-direction, is denoted as phase encoding direction and the respective gradient is denoted as phase gradient or $G_y$. The phase gradient defines a dephasing for each respective k-space line, for example in y-direction.

The direction perpendicular to the slice selection direction and to the phase selection direction is denoted as read-out direction, without restriction of generality as x-direction. A magnetic gradient in the read-out direction is denoted as read-out gradient or $G_x$.

Here and in the following, the spins of the first and second material being in-phase can be understood as the respective spins including a phase angle of 0°, at least theoretically. The spins being out-of-phase can be understood as the spins having opposite phases or including a phase angle of 180°, at least theoretically.

The momentum space can also be denoted as k-space or reciprocal space. In particular, the momentum space and the position space are related to each other via a Fourier transform.

In particular, the first material may correspond to or comprise fat molecules while the second material may correspond to or comprise water molecules.

By applying the one or more excitation pulses, spins of both materials are excited. However, since protons of different materials, for example of water and fat molecules, may have slightly different resonance frequencies with respect to the nuclear spin position, their spins go in-phase and out-of-phase with each other as a function of time.

Acquiring the echo signals comprises, in particular, recording the respective signal intensities in momentum space or over time, respectively, by means of respective read-out coils.

In case of a symmetric sampling, a respective acquisition period covers more or less identical portions of positive momenta and negative momenta in read-out direction.

By sampling the momentum space in read-out direction asymmetrically, a reduced portion of the respective momentum space is sampled either on the side of positive momenta or on the side of negative momenta in read-out direction. By reducing the portion of the sampled momentum space, less acquisition time is required. Therefore, the overall measurement time for the out-of-phase echo signal is reduced according to the improved concept.

According to several implementations of the method according to the improved concept, the momentum space is sampled symmetrically or approximately symmetrically in the read-out direction for acquiring the in-phase echo signal.

According to several implementations, an excitation pulse is applied, in particular to the object, to excite the spins of the first material and the second material. After the excitation pulse, a pre-phasing gradient lobe is applied and after the pre-phasing gradient lobe has ended, a first read-out gradient lobe is applied to acquire the out-of-phase echo signal. Therein, the pre-phasing gradient lobe and the read-out gradient lobe are designed, dimensioned or applied such that a momentum change due to the pre-phasing gradient lobe and the momentum change due to the first read-out gradient lobe cause the asymmetric sampling.

The pre-phasing gradient lobe and the read-out gradient lobe may have the same polarity or opposite polarities depending on whether a spin echo sequence or a gradient echo sequence is employed.

Here and in the following, applying a gradient lobe can be considered as switching on a magnetic field gradient over a respective time period without a change in polarity of the gradient.

In particular, the pre-phasing gradient lobe is applied in read-out direction.

The amplitude of the pre-phasing lobe may be greater than or equal to zero.

A momentum change due to a gradient lobe is proportional to a time integral over the respective magnetic field gradient during the time period of the lobe. Therefore, the amplitude and the duration of the respective gradient lobes uniquely define the respective momentum changes.

That the momentum changes cause the asymmetric sampling can be understood such that the pre-phasing gradient lobe and the read-out gradient lobe, in particular their amplitudes and/or time periods, are adjusted to each other, such that the asymmetric sampling results.

In particular, the momentum change due to the pre-phasing gradient lobe is equal to or greater than zero and is smaller than half of the momentum change due to the read-out gradient lobe. In other words, the ratio of the absolute value of the momentum change due to the pre-phasing gradient lobe to the absolute value of the momentum change due to the read-out gradient lobe is smaller than ½.

By choosing the momentum change due to the pre-phasing lobe as described, the acquisition of the out-of-phase echo signal starts closer to the center of the k-space and by choosing the momentum change of the read-out gradient lobe accordingly, the extent of sampling on the opposite side of the k-space is greater. In this way, the asymmetric sampling can be realized in a particularly simple way.

Depending on the details of the acquisition sequence actually used, a rewinding gradient lobe may be applied to compensate for the momentum asymmetry. In other implementations, such rewinding may not be necessary, for example, if a gradient echo-based Dixon method is used.

According to several implementations, the absolute value of the momentum change due to the pre-phasing gradient lobe is smaller than one half of the absolute value of the momentum change due to the first read-out gradient lobe, in particular is smaller than 25%, for example smaller than 10%, in particular smaller than 5%.

The smaller the momentum change due to the pre-phasing gradient lobe, the more asymmetric the sampling of the k-space in read-out direction becomes for the out-of-phase echo signal and, correspondingly, the more the acquisition time is reduced.

According to several implementations, the momentum change due to the pre-phasing gradient lobe is zero or, in other words, the amplitude of the pre-phasing gradient lobe is zero or, in other words, no pre-phasing gradient lobe is applied.

In this case, a maximum asymmetry of the sampling is achieved since only positive or only negative momenta in read-out directions are sampled. Consequently, a maximum reduction of acquisition time is achieved.

According to several implementations, after the first read-out gradient lobe has ended, in particular directly after the first read-out gradient lobe has ended, a second read-out gradient lobe is applied to acquire the in-phase echo signal.

The second read-out gradient lobe and the first read-out gradient lobe have, in particular, opposite polarities.

In particular, there is no further excitation pulse nor is there a refocusing pulse applied between the first read-out gradient lobe and the second read-out gradient lobe. Such a sequence can be considered as a fast Dixon acquisition scheme. The improved concept is particularly beneficial in such cases.

In particular, since the echo signals are centered around zero transitions of the momentum in read-out direction, the asymmetric sampling causes a shorter echo spacing as compared to fast Dixon imaging with symmetric sampling. Therefore, the acquisition time may be reduced, while the signal to noise ratio may be retained. This may be beneficial particularly for relatively small main magnetic field strengths, in particular for field strengths smaller than 1.5 T. In this case, the time interval $\Delta t$ between in-phase and out-of-phase condition represents the limiting factor, since it becomes greater than approximately 2.4 ms.

From an alternative point of view, the acquisition time for acquiring the in-phase echo signal can be increased. In this way, a higher spatial resolution may be achieved. This may be particularly beneficial for intermediate or high field strengths of the main magnetic field, for example, for field strengths greater than 1.5 T, wherein $\Delta t$ limits the spatial resolution due to dwell time restrictions.

According to several implementations, a further excitation pulse is applied and a further pre-phasing gradient lobe is applied and after further pre-phasing gradient lobe, a further read-out gradient lobe is applied to acquire the in-phase echo signal.

In other words, the in-phase echo signal and the out-of-phase echo signal are acquired in response to different excitation pulses. This may be considered as a regular Dixon imaging scheme.

According to several implementations, after applying the excitation pulse, a refocusing pulse is applied to the object. The pre-phasing gradient lobe is applied between the excitation pulse and the refocusing pulse and the first read-out gradient lobe is applied after the refocusing pulse.

The refocusing pulse can also be denoted as 180° pulse or inversion pulse. In particular, a time period between the excitation pulse and the refocusing pulse may be TE/2, wherein TE denotes the echo time.

In particular, applying the excitation pulse and the refocusing pulse as described corresponds to a spin echo sequence.

According to several implementations, the pre-phasing gradient lobe and the read-out gradient lobe have the same polarity.

According to several implementations, the method according to the improved concept is based on a spin echo acquisition technique or a turbo spin acquisition technique.

According to several implementations, the pre-phasing gradient lobe and the first read-out gradient lobe have opposite polarities.

In particular, the method is based on a gradient echo acquisition technique.

In particular, in such case, no refocusing pulse is used, in particular there is no refocusing pulse between the pre-phasing gradient lobe and the first read-out gradient lobe.

According to several implementations, a further out-of-phase echo signal is acquired when the spins of the first material and the spins of the second material are out-of-phase, wherein the momentum space is sampled asymmetrically in the read-out direction for acquiring the further out-of-phase echo signal.

The out-of-phase echo signal and the further out-of-phase echo signal can be acquired in response to the same excitation period or in response to separate excitation periods. In other words, there may or there may not be a further excitation pulse between acquiring the out-of-phase echo signal and the further out-of-phase echo signal.

For example, the out-of-phase echo signal, the in-phase echo signal and the further out-of-phase echo signal may be acquired in this order directly one after each other without additional RF-pulses, in particular excitation pulses, in between. In other words, a fast Dixon acquisition technique is applied.

In case of a spin echo or turbo spin echo sequence, the out-of-phase echo signal is, in particular, acquired before a further refocusing pulse is applied.

By sampling the momentum space asymmetrically in read-out direction for acquiring the further out-of-phase echo signal, at least a part of the sampled momentum space has not been sampled before for acquiring the out-of-phase echo signal. Therein, the momentum spaces sampled by acquiring the out-of-phase echo signal and the further out-of-phase echo signal, respectively, may or may not overlap around $k_x=0$.

According to several implementations, a third read-out gradient lobe is applied to acquire the further out-of-phase echo signal, in particular, after or directly after the second read-out gradient lobe has ended.

In case, the out-of-phase echo signal and the in-phase echo signal are acquired in response to the same excitation pulse, the gradient must be rewound anyways. Consequently, the further out-of-phase echo signal can be acquired without additional time penalty.

By acquiring the further out-of-phase echo signal, the "missing" portion of momentum space that has not been sampled for acquiring the out-of-phase echo signal may be covered.

According to several implementations, a phase-difference-map is generated by the computing unit depending on the out-of-phase echo signal and on the further out-of-phase echo signal. The first image and/or the second image is generated by the computing unit based on the phase-difference-map.

In particular, the first image and/or the second image is generated based on the phase-difference-map and the out-of-phase echo signal or based on the phase-difference-map and the further out-of-phase echo signal.

In this way, different phase patterns due to eddy currents in the out-of-phase echo signal and the further out-of-phase echo signal may compensated.

According to several implementations, an out-of-phase-map is generated by the computing unit depending on the out-of-phase echo signal and an in-phase map is generated by the computing unit depending on the in-phase echo signal. The in-phase map and the out-of-phase-map are used as input by the computing unit to generate the first image and/or the second image.

The out-of-phase-map may, in particular, be generated by sampling a plurality of lines perpendicular to the read-out direction in k-space and storing the respective signal intensities for all sampled momenta, for example in x- and y-direction. The in-phase map may be generated analogously.

By combining or processing the in-phase map and the out-of-phase-map with different, respective maps representing only the first material and/or representing only the second material, in particular the first and the second image, may be computed.

According to several implementations, the first image and/or the second image is generated by the computing unit based on a Fourier transform of the respective superimposed maps.

According to several implementations, the out-of-phase-map is generated by the computing unit based on the out-of-phase echo signal or based on the further out-of-phase echo signal or based on the out-of-phase echo signal and the further out-of-phase echo signal.

According to several implementations, the out-of-phase-map may be generated based on a phase-corrected-map and the out-of-phase echo signal, in particular based on the phase-corrected-map and a first out-of-phase-map, which is generated based on the out-of-phase echo signal.

Therein, the phase-corrected-map is for example generated based on the phase-difference-map and the out-of-phase echo signal.

Alternatively, the out-of-phase-map may be generated based on the phase-corrected-map and the further out-of-phase echo signal, in particular based on the phase-corrected-map and a second out-of-phase-map, which is generated based on the further out-of-phase echo signal.

Therein, the phase-corrected-map is for example generated based on the phase-difference-map and the further out-of-phase echo signal.

According to several implementations, a first out-of-phase-map is generated by the computing unit depending on the out-of-phase echo signal and a second out-of-phase-map is generated depending on the further out-of-phase echo signal. The computing unit performs a Fourier transform of respective parts of the first and the second out-of-phase-maps, the respective parts comprising the center of the k-space in x- and y-plane. The computing unit subtracts the Fourier transformed maps to generate the phase-difference-map. The phase-difference-map is interpolated by the computing unit to full resolution. One of the first and the second out-of-phase-map is Fourier transformed and corrected by means of the interpolated phase-difference-map. The corrected first or second out-of-phase-map and the remaining of the first or second out-of-phase-map are combined in momentum space or in position space and the first and/or the second image is reconstructed based on the combination and the in-phase map by respective superimpositions.

According to the improved concept, also a magnetic resonance imaging system is provided. The MRI system comprises an MRI scanner and a controller, wherein the controller is configured to control the MRI scanner to apply an excitation pulse to the object to excite spins of a first material of the object and spins of a second material of the object. The controller is further configured to control the MRI scanner to acquire an in-phase echo signal when the spins of the first material and the spins of the second material are in-phase. The MRI system further comprises a controller, configured to generate a first image for the first material, configured to generate a first image for the first material and/or a second image for the second material depending on the in-phase echo signal and the out-of-phase echo signal. The controller is further configured to control the MRI scanner to sample a momentum space asymmetrically in a read-out direction to acquire the out-of-phase echo signal.

The computing unit may, for example, comprise the controller at least partly or vice versa or the computing unit and the controller may be implemented separately from each other.

The MRI scanner can be understood as a device comprising respective coils for generating RF-pulses, such as the excitation pulse, and coils for generating the main magnetic field as well as respective field gradients in three-spatial dimensions.

Further implementations of the MRI system according to the improved concept follow directly from the various implementations of the method according to the improved concept and vice versa. In particular, the MRI system according to the improved concept is configured or programmed to perform a method according to the improved concept or the MRI system performs a method according to the improved concept.

According to the improved concept, a computer program comprising instructions is provided. When the computer program or the instructions, respectively, are executed by a MRI system according to the improved concept, the instructions cause the MRI system to carry out a method according to the improved concept.

According to the improved concept, a computer readable storage medium storing a computer program according to the improved concept is provided.

The computer program and the computer readable storage medium can be considered to represent respective computer program products.

FIG. 1 shows schematically an exemplary implementation of an MRI system 1 according to the improved concept.

The MRI system 1 comprises an MRI scanner 2 and a controller 3 for controlling the MRI scanner 2.

Furthermore, the MRI system or the controller 3 may comprise a computing unit 4, such as a computer. The controller 3 may be coupled to the MRI scanner 2. The MRI system 1 may also comprise a memory storage unit 28. The memory storage unit 28 may, for example, store a computer program according to the improved concept. In an exemplary embodiment, the controller may include the memory storage unit 28. In an exemplary embodiment, the controller 3 includes processor circuitry that is configured to perform one or more functions and/or operations of the controller 3.

The MRI system 1 may be used to carry out a method according to the improved concept. In particular, the computing unit 4 may execute the computer program according to the improved concept to cause the MRI system 1 to carry out the method.

In the following, the function of the MRI system 1 is explained in more detail with respect to several implementations of methods according to the improved concept by reference FIGS. 2 to 6.

Figure 6:
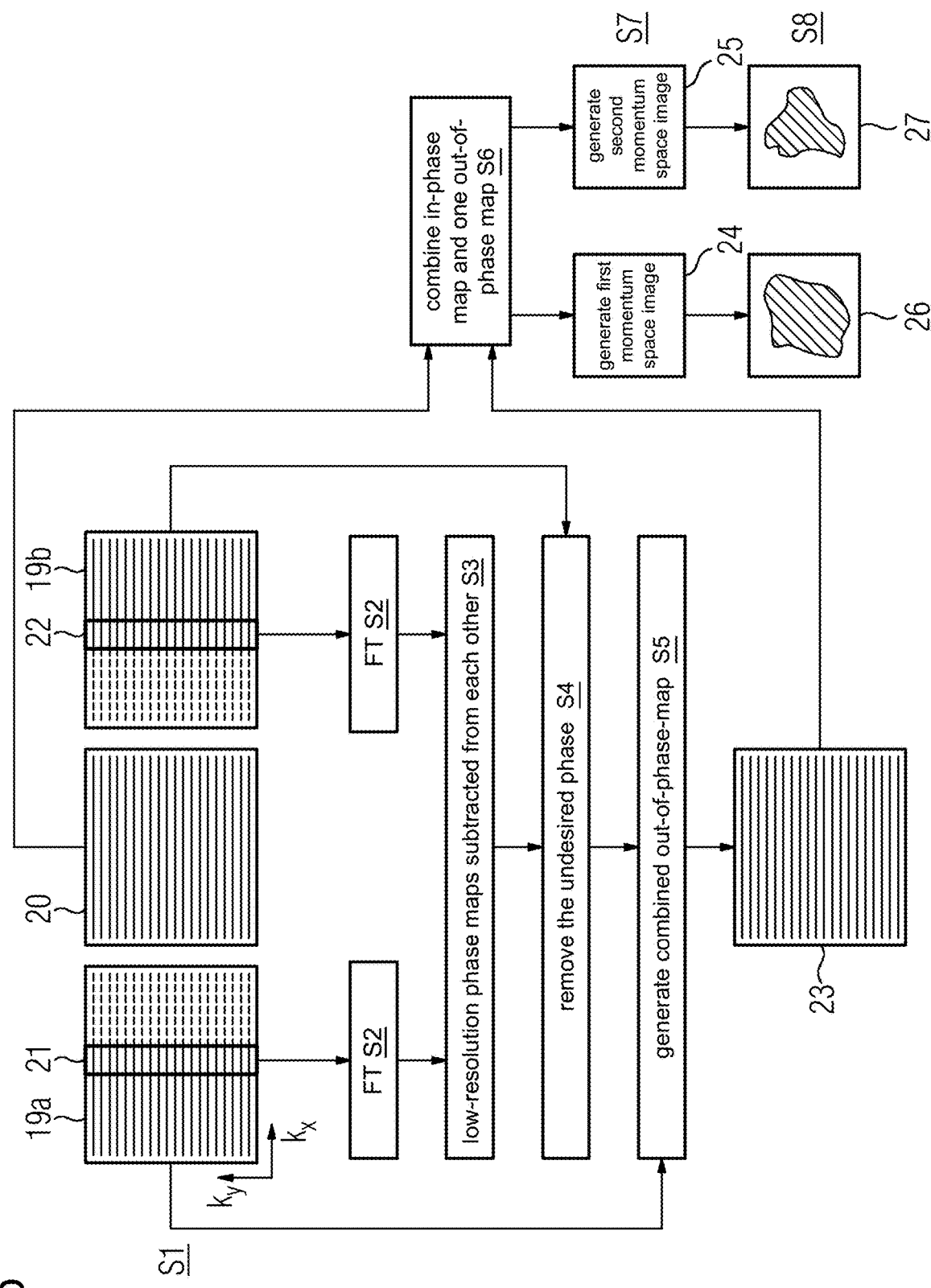
FIG. 6 is a flowchart of a method according to an exemplary embodiment of the present disclosure.

FIG. 6 shows a flow diagram of an exemplary implementation of a method according to the improved concept.

In step S1, a first out-of-phase-map 19a and a second out-of-phase-map 19b as well as an in-phase map 20 are generated by the MRI system 1, as explained in the following with reference to FIGS. 2 to 4.

Figure 2:
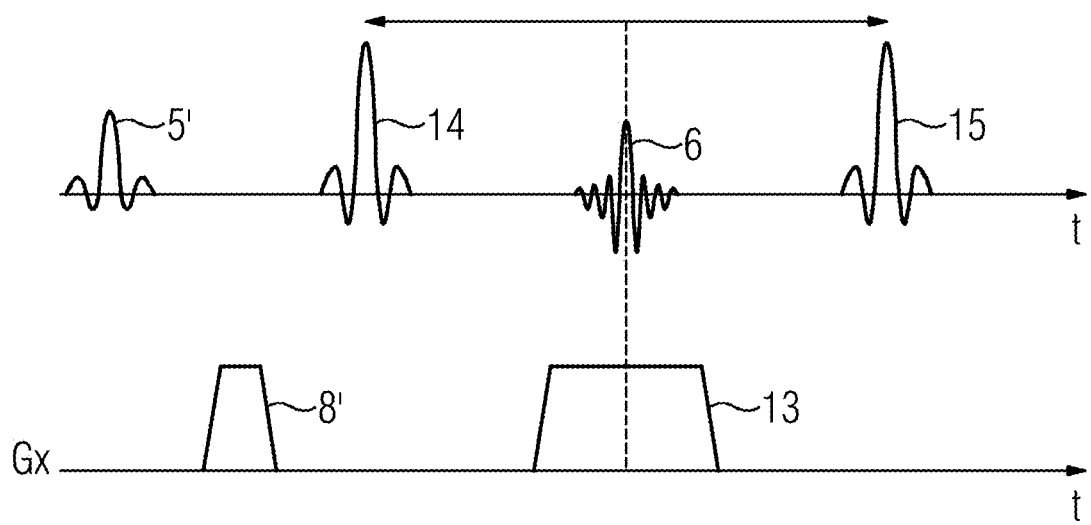
FIG. 2 illustrates a pulse diagram of a method according to an exemplary embodiment of the present disclosure.
Figure 3:
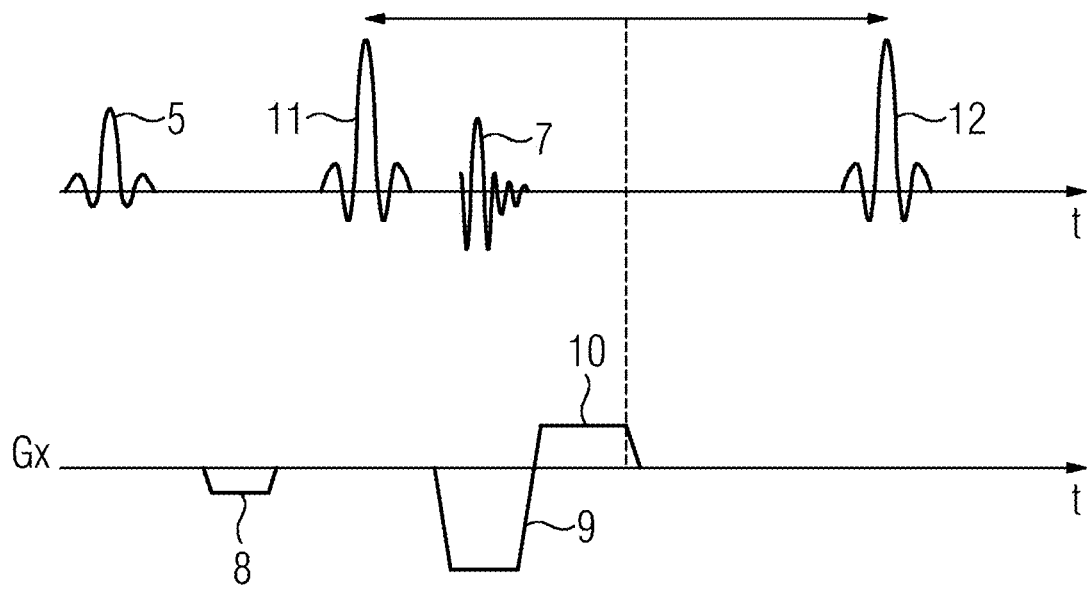
FIG. 3 illustrates a pulse diagram of a method according to an exemplary embodiment of the present disclosure.
Figure 4:
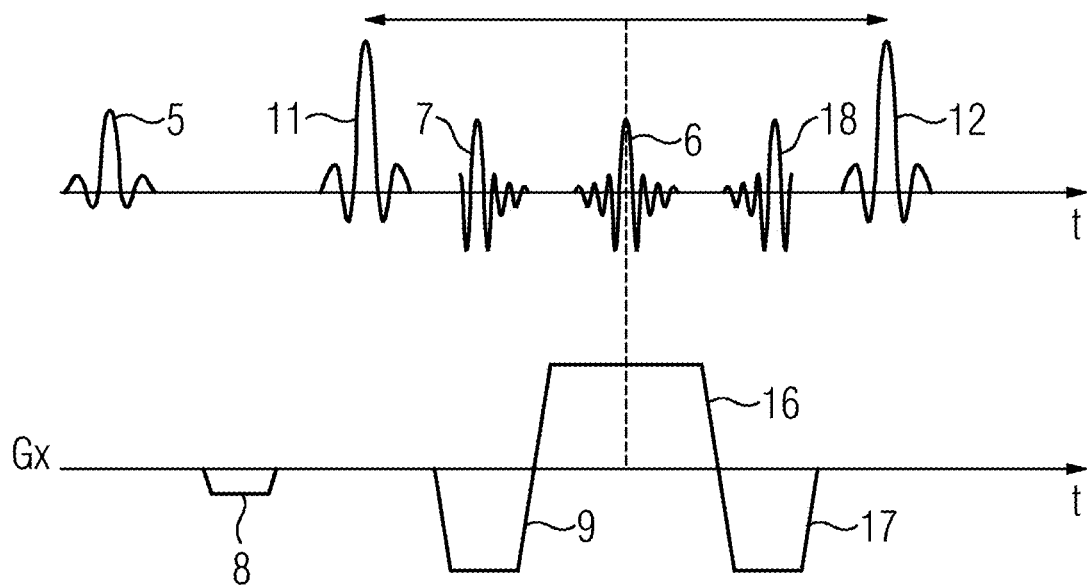
FIG. 4 illustrates a pulse diagram of a method according to an exemplary embodiment of the present disclosure.

FIGS. 2 to 4 show pulse diagrams for respective parts of MRI acquisition sequences. In the respective top panels, the applied or acquired RF-pulses are shown as a function of time t. In the respective bottom panels, the magnetic field gradient $G_x$ in read-out direction is shown as a function of time.

FIG. 2 shows how an in-phase echo signal 6 may be acquired in a method according to the improved concept. The controller 3 controls the MRI scanner 2 to generate an excitation pulse 5' by means of a respective coil to excite nuclear spins of an object (not shown) located in the MRI scanner 2. In particular, nuclear spins of fat molecules and nuclear spins of water molecules of the object are excited by the excitation pulse 5'.

Afterwards, the controller 3 controls the MRI scanner 2 to apply a pre-phasing gradient lobe 8' to select the respective starting point in k-space. Then, the controller 3 controls the MRI scanner 2 to apply a refocusing pulse 14 to flip the nuclear spins by 180°. The controller 3 may control the MRI scanner 2 to apply a further refocusing pulse 15, for example after a time period corresponding to a sequence time. Between the refocusing pulses 14, 15, a read-out gradient lobe 13, which has the same polarity as the pre-phasing gradient lobe 8', is applied by the MRI scanner 2.

Consequently, the in-phase echo signal 6 corresponding to the nuclear spins of the fat and water molecules being in-phase is acquired by the MRI scanner 2.

In FIG. 3, it is shown in a respective pulse diagram, how an out-of-phase echo signal 7 can be acquired in a method according to the improved concept.

In particular, an excitation pulse 5 is applied and after that a further pre-phasing gradient lobe 8 is applied by the MRI scanner 2. Then, a refocusing pulse 11 is applied by the MRI scanner 2 and, for example, a further refocusing pulse 12 may be applied after the sequence time has lapsed by the MRI scanner 2.

After the refocusing pulse 11, a read-out gradient lobe 9, which has the same polarity as the pre-phasing gradient lobe 8, is applied by the MRI scanner 2. In particular, the read-out gradient lobe 9 and the read-out gradient lobe 13 of FIG. 2 have opposite polarities.

Consequently, during the application of the read-out gradient lobe 9, the out-of-phase echo signal 7 corresponding to the nuclear spins of the water and fat molecules having opposite phases, may be acquired by the MRI scanner 2.

According to the improved concept, the read-out gradient lobe 9 and the pre-phasing gradient lobe 8 are adjusted with respect to their respective amplitudes and/or durations to achieve an asymmetric sampling of the momentum in read-out direction, which is the $k_x$-direction in the present example. To this end, the momentum change due to the pre-phasing gradient lobe 8 is less than one half of the momentum change due to the read-out gradient lobe 9. After the read-out gradient lobe 9, a rewinding gradient lobe 10 may be applied by the MRI scanner 2 in order to rewind the asymmetry properly.

The steps described with respect to FIGS. 2 and 3 may be repeated for different lines in k-space, in particular, for different values of $k_y$, until the desired part of the momentum space is sampled for in-phase conditions and out-of-phase conditions, respectively.

In particular, the $k_x/k_y$-momentum space is sampled asymmetrically for the out-of-phase conditions and symmetrically for the in-phase conditions, as depicted in FIG. 6, where the resulting in-phase map 20 and out-of-phase-map 19a are depicted.

FIG. 4 shows an approach to acquire the in-phase echo signal 6 and the out-of-phase echo signal 7 based on the same excitation pulse 5 according to a spin echo acquisition technique or a turbo spin echo acquisition technique.

To this end, the excitation pulse 5, the pre-phasing gradient lobe 8, the refocusing pulses 11, 12 and the read-out gradient lobe 8 are applied as described with respect to FIG. 3. Consequently, the out-of-phase echo signal 7 is acquired as described with respect to FIG. 3.

Directly after the read-out gradient lobe 9, a further read-out gradient lobe 16 with opposite polarity is applied to acquire the in-phase echo signal 6. In particular, the in-phase echo signal 6 is acquired by symmetric sampling of the k-space.

Directly after the further read-out gradient lobe 16 has ended, a further read-out gradient lobe 16 may be applied, which has the same polarity as the read-out gradient lobe 9 and causes the same momentum change as the read-out gradient lobe 9. Consequently, a further out-of-phase echo signal 18 is acquired. Therein, all echo signals 6, 7, 18 are acquired between the first and the second refocusing pulse 11, 12.

In particular, the out-of-phase echo signal 7 and the further out-of-phase echo signal 18 are acquired by sampling different portions of the k-space. Therein, center portions 21, 22 of the k-space in $k_x$-direction may optionally be sampled by both out-of-phase echo signals 7, 18 as indicated in FIG. 6.

Figure 5:
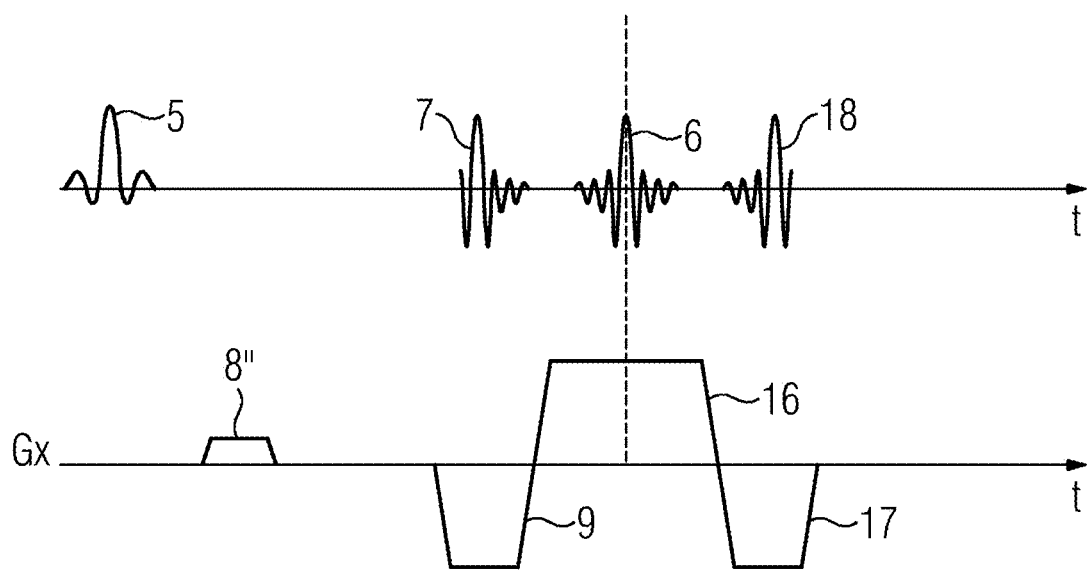
FIG. 5 illustrates a pulse diagram of a method according to an exemplary embodiment of the present disclosure.

FIG. 5 shows an approach to acquire the in-phase echo signal 6 and the out-of-phase echo signal 7 based on the same excitation pulse 5 gradient echo acquisition technique.

Compared to the acquisition according to FIG. 4, no refocusing pulses are required and the polarity of the pre-phasing gradient lobe 8" of FIG. 5 is of opposite polarity with respect to the read-out gradient lobe 9.

Coming back to FIG. 6, the out-of-phase-maps 19a, 19b, and the in-phase map 20 may be generated by sampling the respective desired portions of k-space in the described manner, in particular for various $k_y$.

In step S6, the in-phase map 20 and one of the out-of-phase-maps 19a, 19b are combined in different ways to generate in step S7 a first momentum space image 24 corresponding the first material or fat molecules and a second momentum space image 25 corresponding to the second material or water molecules. Alternatively, the in-phase map 20 and a combined out-of-phase-map 23 are superimposed to generate the momentum space images 24, 25.

In step S8, a first MRI image 26 in position space may be generated by Fourier transform of the first momentum space image 24 and a second MRI image 27 in position space may be generated based on a Fourier transform of the second k-space image 25 in step S8.

Therein, the combined out-of-phase-map 23 may correspond to a simple combination or sum of the out-of-phase-maps 19a, 19b.

In other implementations, the Fourier transform is performed already before step S6 such that the combination of in-phase map 20 and one of the out-of-phase-maps 19a, 19b takes place in position space.

Alternatively, in case the sampled asymmetric k-space portions overlap in the respective center portions 21, 22, a phase correction may applied according to steps S2 to S5 in order to compensate for different phase patterns in the out-of-phase echo signal 7 and the further out-of-phase echo signal 18 due to eddy currents and so forth.

In step S2, the out-of-phase-maps 19a, 19b are Fourier transformed to generate respective low-resolution phase-maps, respectively. In step S3, the low-resolution phase maps may be subtracted from each other to remove an undesired phase portion. To avoid phase wraps, a known phase unwrapping algorithm may optionally be utilized.

Furthermore, the phase-difference-map resulting from the subtraction of the low-resolution phase maps is, for example, interpolated to full resolution and a Fourier transform of the out-of-phase-map 19a or the further out-of-phase-map 19b may be generated.

In step S4, the phase-difference-map may be used to remove the undesired phase from the Fourier transformed out-of-phase-map. Afterwards, the phase compensated out-of-phase-map and the remaining out-of-phase-map may be combined in momentum space or in position space in step S5 to generate the combined out-of-phase-map 23.

To further save acquisition time, the asymmetric acquisition may optionally not acquire any part of the other k-space half. In this case, the pre-phasing gradient lobe 8 is completely omitted. This may be applicable, in particular, in case of slowly changing gradients, where eddy currents may be neglected or if another phase correction method can be performed.

According to the improved concept, acquisition time in in-phase and out-of-phase, in particular Dixon MRI acquisition schemes, can be reduced.

In particular, advantages of the improved concept are described with respect to fast Dixon acquisition schemes, wherein bipolar read-out gradient lobes are employed. In particular, shorter acquisition times at low field systems and higher spatial resolution at mid-field and high-field systems may be achieved. Furthermore, the signal to noise ratio may be retained or even increased.

In case of a fast Dixon acquisition scheme, at low-field systems, $\Delta t$ would lead to a significant increase in echo spacing and thus acquisition time. According to the improved concept, the echo spacing can be reduced and the signal to noise ratio be retained.

At mid- or high-field systems, $\Delta t$ limits the achievable spatial resolution due to dwell time restrictions. Here, the improved concept can be utilized to increase the duration of the in-phase echo and thus the spatial resolution.

As described, the improved concept can also be used to speed up the acquisition of the opposed phase echoes in conventional TSE Dixon imaging. The in-phase echo could be used to further boost the signal to noise ratio or to acquire navigator or correction data, for example to perform a spatial registration of the opposed phase echo train to the in-phase echo train.

Also other Dixon variants such as VIBE Dixon or multi echo acquisitions may benefit from the improved concept.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for magnetic resonance (MR) imaging of an object, comprising:
exciting spins of a first material of the object and spins of a second material of the object;
acquiring an in-phase echo signal in response to the excited spins of the first material and the excited spins of the second material being in phase;
acquiring an out-of-phase echo signal in response to the excited spins of the first material and the excited spins of the second material being out-of-phase, the acquiring of the out-of-phase echo signal including sampling k-space asymmetrically in a read-out direction; and
generating a first image for the first material and/or a second image for the second material based on the in-phase echo signal and the out-of-phase echo signal.

2. A magnetic resonance imaging system comprising:
a magnetic resonance imaging scanner; and
a controller configured to:
control the magnetic resonance imaging scanner to:
apply an excitation pulse to excite spins of a first material of an object and spins of a second material of the object;
acquire an in-phase echo signal in response to the excited spins of the first material and the spins of the second material being in phase; and
acquire an out-of-phase echo signal in response to the spins of the first material and the excited spins of the second material being out-of-phase, the acquiring of the out-of-phase echo signal including sampling k-space asymmetrically in a read-out direction; and
generate a first image for the first material and/or a second image for the second material based on the in-phase echo signal and the out-of-phase echo signal.

3. The method according to claim 1, wherein:
an excitation pulse is applied to excite the spins of the first and the second materials;
after the excitation pulse, a pre-phasing gradient lobe is applied; and
after the pre-phasing gradient lobe, a first read-out gradient lobe is applied to acquire the out-of-phase echo signal, the momentum change due to the pre-phasing gradient lobe and a momentum change due to the first read-out gradient lobe causing the asymmetric sampling.

4. The method according to claim 3, wherein the momentum change due to the pre-phasing gradient lobe is smaller than one half of the momentum change due to the first read-out gradient lobe.

5. The method according to claim 3, wherein after the first read-out gradient lobe, a second read-out gradient lobe is applied to acquire the in-phase echo signal.

6. The method according to claim 3, wherein:
after applying the excitation pulse, a refocusing pulse is applied;
the pre-phasing gradient lobe is applied between the excitation pulse and the refocusing pulse; and
the first read-out gradient lobe is applied after the refocusing pulse.

7. The method according to claim 6, wherein the pre-phasing gradient lobe and the first read-out gradient lobe have a same polarity.

8. The method according to claim 6, wherein the method is based on a spin echo acquisition technique or a turbo spin echo acquisition technique.

9. The method according to claim 3, wherein the pre-phasing gradient lobe and the first read-out gradient lobe have opposite polarities.

10. The method according to claim 9, wherein the method is based on a gradient echo acquisition technique.

11. The method according to claim 1, further comprising acquiring a further out-of-phase echo signal in response to the spins of the first material and the spins of the second material being out-of-phase, wherein k-space is sampled asymmetrically in the read-out direction for acquiring the further out-of-phase echo signal.

12. The method according to claim 11, further comprising:
generating a phase-difference map based on the out-of-phase echo signal and on the further out-of-phase echo signal, wherein the first image and/or the second image is generated based on the phase-difference map.

13. The method according to claim 1, further comprising:
generating an out-of-phase map based on the out-of-phase echo signal;
generating an in-phase map based on the in-phase echo signal; and
superimposing the in-phase map and the out-of-phase map to generate the first image and/or the second image.

14. The method according to claim 1, wherein k-space is sampled symmetrically in the read-out direction to acquire the in-phase echo signal.

15. A non-transitory computer program product which includes a program and is directly loadable into a memory of a MR imaging device, when executed by a processor of the MR imaging device, causes the processor to perform the method as claimed in claim 1.

16. A non-transitory computer-readable storage medium with an executable program stored thereon, that when executed, instructs a processor to perform the method of claim 1.

17. The method according to claim 1, wherein the in-phase echo signal and the out-of-phase echo signal are acquired based on a same excitation pulse with no refocusing pulse applied between a first read-out gradient lobe and a second read-out gradient lobe.

18. The method according to claim 1, wherein sampling k-space asymmetrically in the read-out direction comprises sampling only a portion of k-space in the read-out direction.

19. The method according to claim 1, wherein sampling k-space asymmetrically in the read-out direction comprises sampling only a portion of k-space on a side of positive momenta or a side of negative momenta, in the read-out direction.

* * * * *